(12) United States Patent
Tang

(10) Patent No.: US 9,786,722 B1
(45) Date of Patent: Oct. 10, 2017

(54) DOUBLE-SIDE OLED DISPLAY

(71) Applicant: Wuhan China Star Optoelectronics Technology Co., Ltd., Wuhan, Hubei (CN)

(72) Inventor: Yuejun Tang, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 0 days.

(21) Appl. No.: 15/201,487

(22) Filed: Jul. 3, 2016

(30) Foreign Application Priority Data

May 4, 2016 (CN) .................. 2016 2 03939105 U

(51) Int. Cl.
*H01L 29/08* (2006.01)
*H01L 27/32* (2006.01)

(52) U.S. Cl.
CPC ........ *H01L 27/322* (2013.01); *H01L 27/3276* (2013.01)

(58) Field of Classification Search
CPC .................................................... H01L 27/322
USPC ........................................................ 257/40
See application file for complete search history.

(56) References Cited

U.S. PATENT DOCUMENTS

| | | | |
|---|---|---|---|
| 2010/0164344 A1* | 7/2010 | Boerner ................ | H01L 25/048 313/1 |
| 2015/0236309 A1* | 8/2015 | Rohatgi .................. | H01L 51/56 438/28 |
| 2016/0020263 A1* | 1/2016 | Xu ........................ | H01L 29/423 257/40 |

* cited by examiner

*Primary Examiner* — Long K Tran
(74) *Attorney, Agent, or Firm* — Andrew C. Cheng

(57) ABSTRACT

The disclosure provides a double-side OLED display, the double-side OLED display includes a first light-emitting substrate, a second light-emitting substrate and a color film layer, the first light-emitting substrate and the second light-emitting substrate are disposed opposite, the color film layer is disposed between the first light-emitting substrate and the second light-emitting substrate, light from the first light-emitting substrate partially penetrates the color film layer and forms a second display image on a side of the second light-emitting substrate, light from the second light-emitting substrate partially penetrates the color film layer and forms a first display image on a side of the first light-emitting substrate. The disclosure is capable of simplifying the process and reducing the thickness of the product, meanwhile images on two sides do not influence each other during display on both sides, and directions of two images on both sides are identical.

10 Claims, 3 Drawing Sheets

DOUBLE-SIDE OLED DISPLAY

FIELD OF THE DISCLOSURE

The disclosure relates to an OLED display technical field, and more particularly to a double-side OLED display.

BACKGROUND OF THE DISCLOSURE

A function of double-side display has been a distinguishing feature of an electronic product according with diversification of electronic products.

For instance, a double-side display device inside a mobile phone can show a main screen of the mobile phone on one side, and display time on the other side. Or a double-side display in public can show images to people via both sides. A conventional double-side display device is generally formed by pasting two single-side display panels, such as pasting a liquid crystal display panel and an organic electroluminescent panel, or pasting two organic electroluminescent panels.

A process of pasting two single-side display panels to form a product is complicated, and the product is thick, which cannot fulfill requirements of thin and light products.

SUMMARY OF THE DISCLOSURE

The disclosure provides a double-side OLED display to solve problems of complicated processes and thick products in a conventional technique.

To solve the technical problems above, a proposal provided by the disclosure is: providing a double-side OLED display, the double-side OLED display includes a first light-emitting substrate, a second light-emitting substrate and a color film layer, the first light-emitting substrate and the second light-emitting substrate are disposed opposite, the color film layer is disposed between the first light-emitting substrate and the second light-emitting substrate, light from the first light-emitting substrate partially penetrates the color film layer and forms a second display image on a side of the second light-emitting substrate, light from the second light-emitting substrate partially penetrates the color film layer and forms a first display image on a side of the first light-emitting substrate.

A plurality of light-emitting devices are disposed on the first light-emitting substrate and the second light-emitting substrate, the light-emitting devices on the first light-emitting substrate and the light-emitting devices on the second light-emitting substrate are staggered in a direction perpendicular to the color film layer.

The color film layer includes a plurality of optical filter units, one of the optical filter units includes a first region and a second region, the first region is a region corresponding to the light-emitting devices of the first light-emitting substrate, and the second region is a region corresponding to the light-emitting devices of the second light-emitting substrate.

A black matrix is disposed on the color film layer to separate each of the optical filter units.

The black matrix further separates the first region and the second region on each of the optical filter units.

The first light-emitting substrate and the second light-emitting substrate respectively include a substrate, a TFT/wire layer and a light-emitting device layer, the TFT/wire layer is disposed on the substrate, the light-emitting device layer is disposed above the TFT/wire layer.

The light-emitting layer has a plurality of light-emitting devices, the light-emitting device includes a first electrode, a light-emitting layer and a second electrode, the light-emitting layer is disposed on the first electrode, and the second electrode covers the light-emitting layer.

A pixel restriction layer is disposed between the first electrode and the light-emitting layer of the two adjacent light-emitting devices, to restrict shapes of the first electrode and the light-emitting layer. The color film layer is formed above the second light-emitting substrate, when the double-side OLED display is manufactured, the first light-emitting substrate and the second light-emitting substrate with the color film layer are assembled contrapuntally; or the first light-emitting substrate, the second light-emitting substrate and the color film layer are independent structures, when the double-side OLED display is manufactured, the first light-emitting substrate, the color film layer and the second light-emitting substrate are assembled contrapuntally in sequence.

A dry layer is disposed between the first light-emitting substrate and the color film layer.

Advantages of the disclosure: distinguishing from a conventional technique, according to the disclosure, the first light-emitting substrate and the second light-emitting substrate are disposed opposite, the color film layer is disposed between the two light-emitting substrates, which makes the two light-emitting substrates to share one color film layer, in order to form an image on the other side correspondingly, hence it is unnecessary to paste two display panels to form a double-side display panel, the process is simplified and the thickness is reduced. Moreover, the double-side OLED display of the disclosure can display on the front side, the rear side or both sides, and images on two sides will not disturb each other when both sides are working, views of the two sides are the same.

DETAILED DESCRIPTION OF PREFERRED EMBODIMENTS

Embodiments of the disclosure are described in detail with reference to the accompanying drawings as follows.

Figure 1:
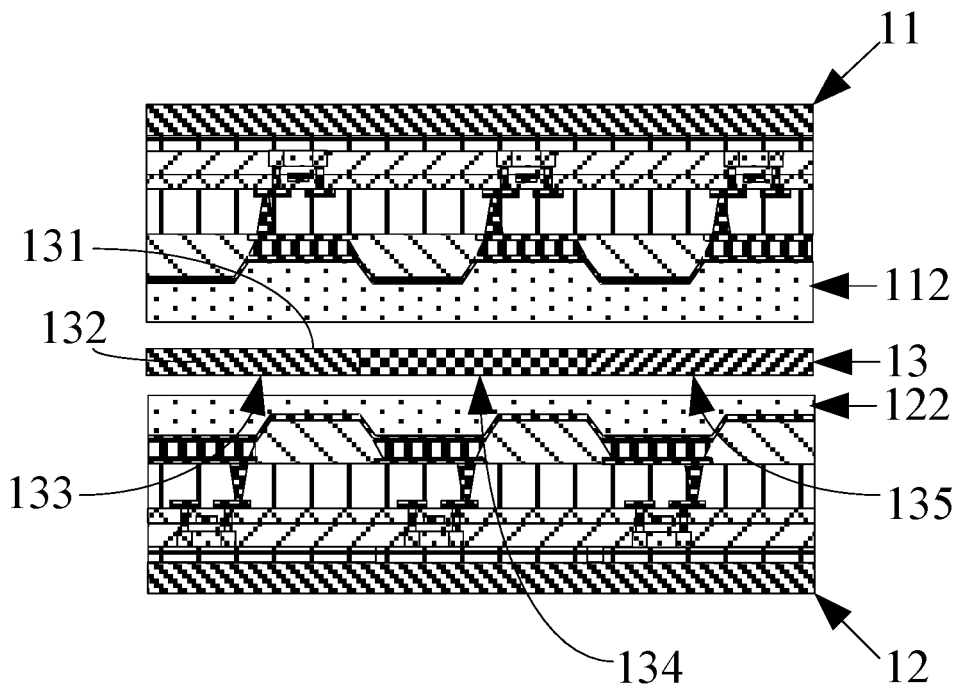
FIG. 1 is a schematic structural view of a double-side OLED display according to a first embodiment of the disclosure.

Referring to FIG. 1, FIG. 1 is a schematic structural view of a double-side OLED display according to a first embodiment of the disclosure.

The double-side OLED display of the disclosure includes a first light-emitting substrate 11, a second light-emitting substrate 12 and a color film layer 13.

Specifically, the first light-emitting substrate 11 and the second light-emitting substrate 12 are disposed opposite, the color film layer 13 is disposed between the first light-emitting substrate 11 and the second light-emitting substrate 12, light from the first light-emitting substrate 11 partially penetrates the color film layer 13 and forms a second display image on a side of the second light-emitting substrate 12, light from the second light-emitting substrate 12 partially penetrates the color film layer 13 and forms a first display image on a side of the first light-emitting substrate 11. Light-emitting materials on the first light-emitting substrate 11 and the second light-emitting substrate 12 radiate white light, displaying numerous colors after passing through the color film layer 13, such as R, G, B. The first display image and the second display image are on two sides of the display, which form a double-side display.

Distinguishing from a conventional technique, according to the disclosure, the first light-emitting substrate 11 and the second light-emitting substrate 12 are disposed opposite, the color film layer 13 is disposed between the two light-emitting substrates, which makes the two light-emitting substrates to share the color film layer 13, in order to form an image on the other side correspondingly, hence it is unnecessary to paste two display panels to form a double-side display panel, the process is simplified and the thickness is reduced. Moreover, the double-side OLED display of the disclosure can display on the front side, the rear side or both sides, and images on two sides will not disturb each other when both sides are working, views of the two sides are the same. For instance, when "q" is displayed on the front side, the rear side also shows "q" instead of "p".

Specifically, a plurality of light-emitting devices are disposed on the first light-emitting substrate 11 and the second light-emitting substrate 12, the light-emitting devices on the first light-emitting substrate 11 and the light-emitting devices on the second light-emitting substrate 12 are staggered in a direction perpendicular to the color film layer 13, staggering open sections of the first light-emitting substrate 11 and the second light-emitting substrate 12 can prevent disturbance of light from the other side during irradiation.

Figure 2:
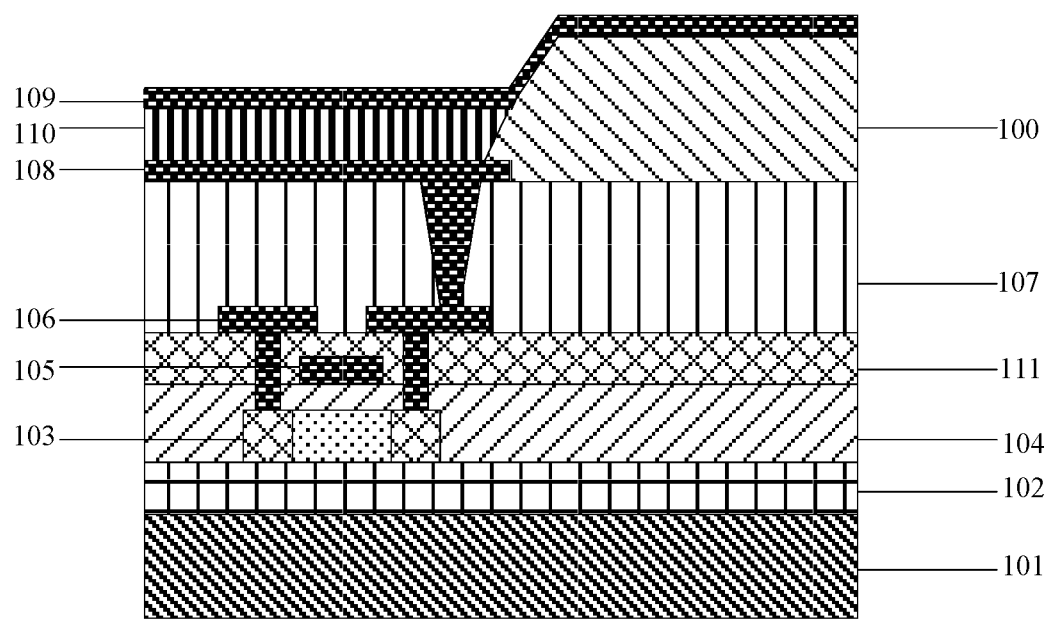
FIG. 2 is a schematic structural view of a light-emitting device according to the disclosure.

Referring to FIG. 2 as well, FIG. 2 is a schematic structural view of a light-emitting device according to the disclosure. The first light-emitting substrate 11 and the second light-emitting substrate 12 each include a substrate 101, a TFT/wire layer and a light-emitting device layer, the TFT/wire layer is disposed on the substrate 101, the light-emitting device layer is disposed above the TFT/wire layer, which can reduce influence of other structures on light.

Specifically, in the embodiment, a buffer layer 102 is disposed on the substrate 101, the TFT/wire layer is disposed on the buffer layer 102, the TFT/wire layer includes numerous TFTs, the TFT includes a semiconductor layer 103, a gate insulating layer 104, a gate pattern layer 105, a source/drain electrode pattern layer 106 and an interlamination insulating layer 111, the semiconductor layer 103 is disposed on the buffer layer 102, the gate insulating layer 104 covers the semiconductor layer 103, the gate pattern layer 105 is disposed above the gate insulating layer 102, the interlamination insulating layer 111 covers the gate pattern layer 105, the source/drain electrode pattern layer 106 is disposed on the interlamination insulating layer 111.

In particular, a top gate type LTPS-TFT switch structure is described in the embodiment, in other embodiments, other types of TFT structures and semiconductor materials work as well, which is not a limitation.

A flat layer 107 is disposed on the TFT, the light-emitting devices are disposed on the flat layer 107, the numerous light-emitting devices are disposed on the light-emitting layer, the light-emitting device includes a first electrode 108, a light-emitting layer 110 and a second electrode 109, the first electrode 108 (anode) is disposed correspondingly to the TFTs, the light-emitting layer 110 is disposed on the first electrode 108, the second electrode 109 (cathode) covers the light-emitting layer 110. It is comprehensible that in other embodiments, the first electrode 108 can be a cathode, the second electrode 109 can be an anode.

Furthermore, a pixel restriction layer 100 is disposed between the first electrode 108 and the light-emitting layer 110 of two adjacent light-emitting devices, to restrict shapes of the first electrode 108 and the light-emitting layer 110, the pixel restriction layer 100 is disposed adjacently to the first electrode 108 and the light-emitting layer 110, and in the embodiment, the second electrode 109 covers the pixel restriction layer 100. Specifically, the pixel restriction layer 100 is made out of a transparent insulating material, for instance, transparent resin or a transparent inorganic material. Moreover, the pixel restriction layer 100 can further prevent the first electrode 108 and the second electrode 109 establishing a short circuit in an end. The pixel restriction layer 100 on the first light-emitting substrate 11 and the light-emitting layer 110 on the second light-emitting substrate 12 are corresponding, and the pixel restriction layer 100 on the second light-emitting substrate 12 and the light-emitting layer 110 on the first light-emitting substrate 11 are corresponding. As shown in FIG. 1, the color film layer 13 includes a plurality of optical filter units, one of the optical filter units includes a first region 131 and a second region 132, the first region 131 is a region corresponding to the light-emitting devices of the first light-emitting substrate 11, the second region 132 is a region corresponding to the light-emitting devices of the second light-emitting substrate 12. Only the first region 131 and the second region 132 of one optical filter unit are marked in FIG. 1, actually, other optical filter units also include the first region 131 and the second region 132.

The color film layer 13 of the embodiment includes a red resist 133, a green resist 134 and a blue resist 135, the red resist 133 forms a red optical filter unit, the green resist 134 forms a green optical filter unit, the blue resist 135 forms a blue optical filter unit. Certainly, in other embodiments, the color film layer 13 can likewise include a red resist, a green resist, a blue resist and a white resist.

Furthermore, a flat layer or a packaging layer can be disposed above the light-emitting device layer of the first light-emitting substrate 11 and the second light-emitting substrate 12, the packaging layer can be a thin film packaging layer. The flat layer and the packaging layer or either of them can be included in some embodiments, for instance, in the embodiment, a flat layer 112 is disposed on the light-emitting layer of the first light-emitting substrate 11, a flat layer 122 is disposed on the light-emitting layer of the second light-emitting substrate 12, or both can be included in other embodiments as well.

The first light-emitting substrate 11, the second light-emitting substrate 12 and the color film layer 13 of the disclosure can be independent structures respectively, the first light-emitting substrate 11, the second light-emitting substrate 12 and the color film layer 13 are assembled contrapuntally during manufacture of a double-side OLED display simultaneously.

An assembly process of the double-side OLED display of the disclosure can also be: first transferring and pasting the color film layer 13 onto one of the first light-emitting substrate 11 and the second light-emitting substrate 12, for instance, pasting on the first light-emitting substrate 11, then assembling the second light-emitting substrate 12 and the first light-emitting substrate 11 with the color film layer 13 contrapuntally.

Certainly, an assembly process of the double-side OLED display of the disclosure can also be: forming the color film layer 13 above the second light-emitting substrate 12, assembling the first light-emitting substrate 11 and the second light-emitting substrate 12 with the color film layer 13 contrapuntally.

It is unnecessary to paste after forming two display panels in the assembly processes above, which can simplify the process and reduce the thickness of the product.

Figure 3:
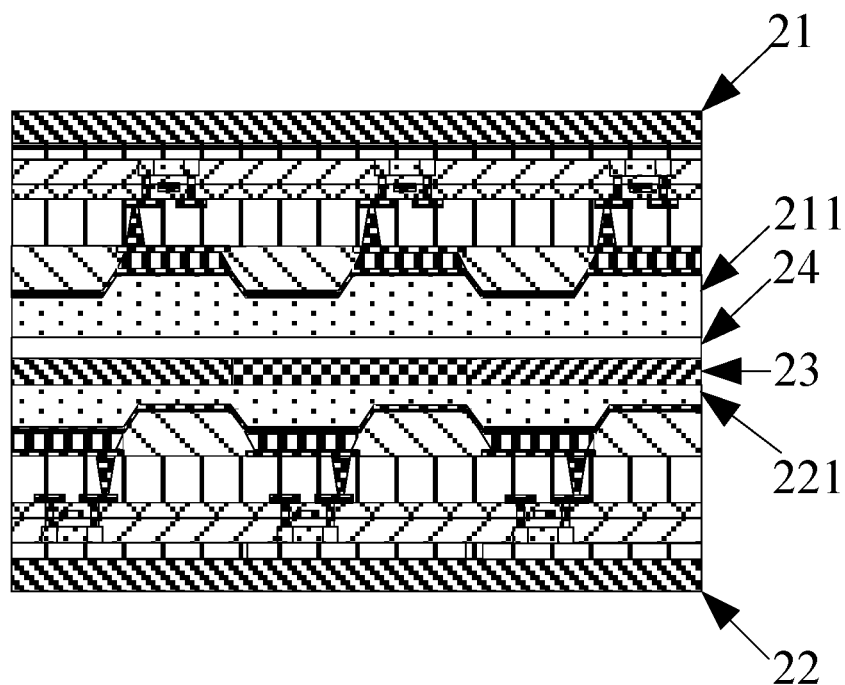
FIG. 3 is a schematic structural view of a double-side OLED display according to a second embodiment of the disclosure.

Referring to FIG. 3, FIG. 3 is a schematic structural view of a double-side OLED display according to a second embodiment of the disclosure.

The double-side OLED display of the disclosure includes a first light-emitting substrate 21, a second light-emitting substrate 22 and a color film layer 23.

Specifically, the first light-emitting substrate 21 and the second light-emitting substrate 22 are disposed opposite, the color film layer 23 is disposed between the first light-emitting substrate 21 and the second light-emitting substrate 22, light from the first light-emitting substrate 21 partially penetrates the color film layer 23 and forms a second display image on a side of the second light-emitting substrate 22, light from the second light-emitting substrate 22 partially penetrates the color film layer 23 and forms a first display image on a side of the first light-emitting substrate 21. The first display image and the second display image are on two sides of the display respectively, which form a double-side display.

The first light-emitting substrate 21 of the disclosure includes a substrate 201, a TFT/wire layer and a light-emitting device layer and a flat layer 211, the second light-emitting substrate 22 includes a substrate 201, a TFT/wire layer and a light-emitting device layer and a flat layer 221, certainly, in other embodiments, the flat layer 211 and the flat layer 221 can also be packaging layers, or the first light-emitting substrate 21 and the second light-emitting substrate 22 respectively include a flat layer and a packaging layer.

In the embodiment, the color film layer 23 is formed above the flat layer 211 of the second light-emitting substrate 22, only assembling the first light-emitting substrate 21 and the second light-emitting substrate 22 with the color film layer 23 contrapuntally is necessary during manufacture of a double-side OLED display, which can simplify the process and reduce the thickness of the product.

Furthermore, a gap is defined between the flat layer 211 and the color film layer 23 of first light-emitting substrate 21 of the embodiment, in an embodiment, the gap retains a hollow gap. But in the embodiment, a dry layer 24 is disposed in the gap to reduce infiltration of moisture and oxygen, in order to prolong service life of the double-side OLED display.

Figure 4:
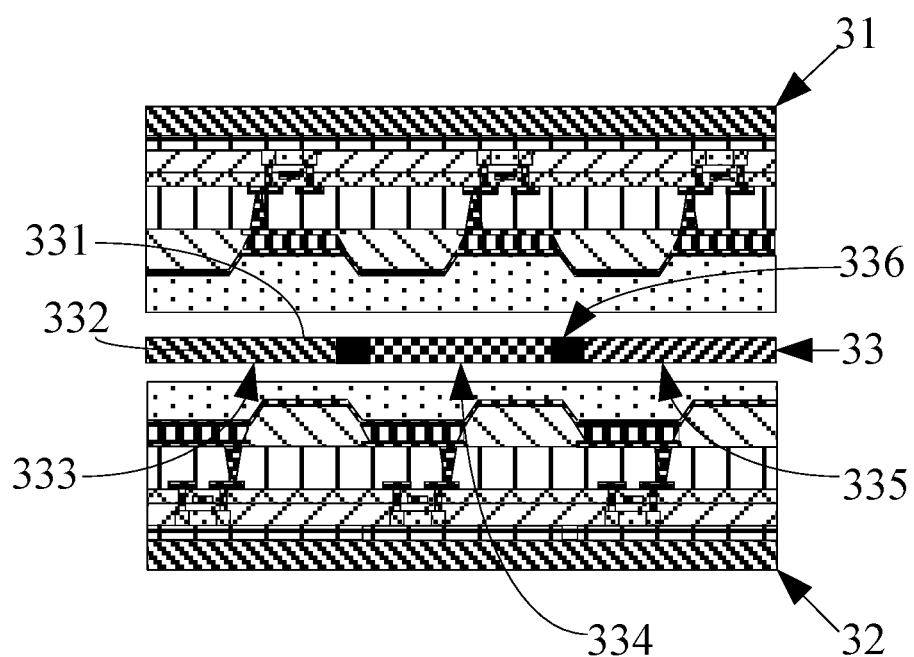
FIG. 4 is a schematic structural view of a double-side OLED display according to a third embodiment of the disclosure.

Referring to FIG. 4, FIG. 4 is a schematic structural view of a double-side OLED display according to a third embodiment of the disclosure.

The double-side OLED display of the embodiment includes a first light-emitting substrate 31, a second light-emitting substrate 32 and a color film layer 33.

Specifically, the first light-emitting substrate 31 and the second light-emitting substrate 32 are disposed opposite, the color film layer 33 is disposed between the first light-emitting substrate 31 and the second light-emitting substrate 32, light from the first light-emitting substrate 31 partially penetrates the color film layer 33 and forms a second display image on a side of the second light-emitting substrate 32, light from the second light-emitting substrate 32 partially penetrates the color film layer 33 and forms a first display image on a side of the first light-emitting substrate 31. The first display image and the second display image are on two sides of the display respectively, which form a double-side display.

Specifically, a plurality of light-emitting devices are disposed on the first light-emitting substrate 31 and the second light-emitting substrate 32, the light-emitting devices on the first light-emitting substrate 31 and the light-emitting devices on the second light-emitting substrate 32 are staggered in a direction perpendicular to the color film layer 33, staggering open sections of the first light-emitting substrate 31 and the second light-emitting substrate 32 can prevent disturbance of light from the other side during irradiation.

The first light-emitting substrate 31 and the second light-emitting substrate 32 each include a substrate, a TFT/wire layer and a light-emitting device layer, the TFT/wire layer is disposed on the substrate, the light-emitting device layer is disposed above the TFT/wire layer, which can reduce influence of other structures on light.

The color film layer 33 includes a plurality of optical filter units, one of the optical filter units includes a first region 331 and a second region 332, the first region 331 is a region corresponding to the light-emitting devices of the first light-emitting substrate 31, the second region 332 is a region corresponding to the light-emitting devices of the second light-emitting substrate 32, only the first region 331 and the second region 332 of one optical filter unit are marked in FIG. 4, actually, other optical filter units also include the first region 331 and the second region 332.

In the embodiment, a black matrix 336 is disposed on the color film layer 33 to separate each of the optical filter units, which can prevent color impurity caused by a long distance between the color film layer 33 and the first light-emitting substrate 31/the second light-emitting substrate 32 and improve quality of a display image.

The color film layer 33 of the embodiment includes a red resist 333, a green resist 334 and a blue resist 335, the red resist 333 forms a red optical filter unit, the green resist 334 forms a green optical filter unit, the blue resist 335 forms a blue optical filter unit. Certainly, in other embodiments, the color film layer can likewise include a red resist, a green resist, a blue resist and a white resist.

Figure 5:
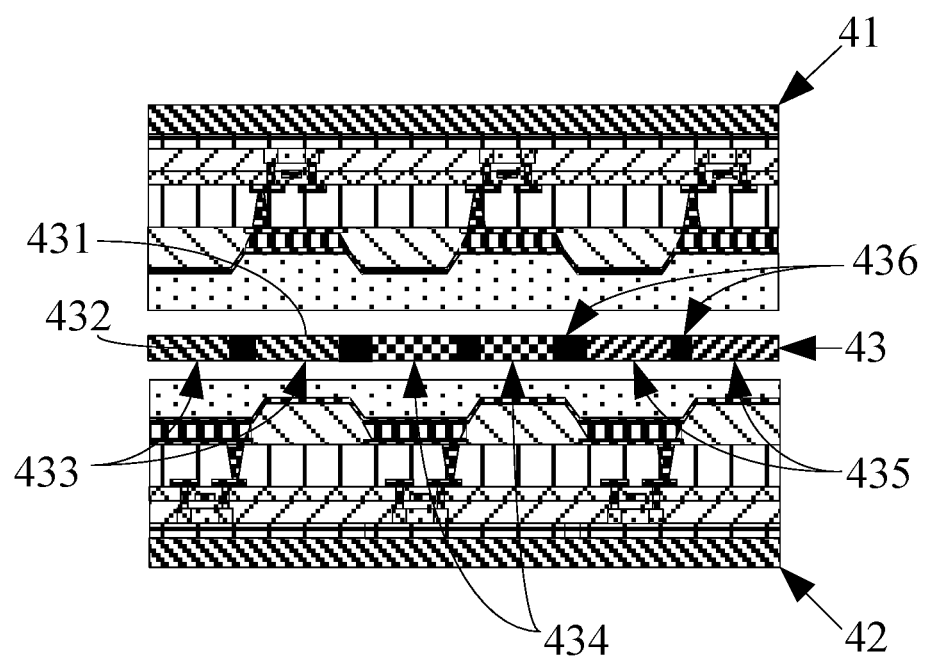
FIG. 5 is a schematic structural view of a double-side OLED display according to a fourth embodiment of the disclosure.

Referring to FIG. 5, FIG. 5 is a schematic structural view of a double-side OLED display according to a fourth embodiment of the disclosure.

The double-side OLED display of the embodiment includes a first light-emitting substrate 41, a second light-emitting substrate 42 and a color film layer 43.

Specifically, the first light-emitting substrate 41 and the second light-emitting substrate 42 are disposed opposite, the color film layer 43 is disposed between the first light-emitting substrate 41 and the second light-emitting substrate 42, light from the first light-emitting substrate 41 partially penetrates the color film layer 43 and forms a second display image on a side of the second light-emitting substrate 42, light from the second light-emitting substrate 42 partially penetrates the color film layer 43 and forms a first display image on a side of the first light-emitting substrate 41. The first display image and the second display image are on two sides of the display respectively, which form a double-side display.

Specifically, a plurality of light-emitting devices are disposed on the first light-emitting substrate 41 and the second light-emitting substrate 42, the light-emitting devices on the first light-emitting substrate 41 and the light-emitting devices on the second light-emitting substrate 42 are staggered in a direction perpendicular to the color film layer 43, staggering open sections of the first light-emitting substrate 41 and the second light-emitting substrate 42 can prevent disturbance of light from the other side during irradiation.

The first light-emitting substrate 41 and the second light-emitting substrate 42 each include a substrate, a TFT/wire layer and a light-emitting device layer, the TFT/wire layer is disposed above the substrate, the light-emitting device layer is disposed above the TFT/wire layer, which can reduce influence of other structures on light.

The color film layer 43 includes a plurality of optical filter units, one of the optical filter units includes a first region 431 and a second region 432, the first region 431 is a region corresponding to the light-emitting devices of the first light-emitting substrate 41, the second region 432 is a region corresponding to the light-emitting devices of the second light-emitting substrate 42.

A black matrix 436 is disposed on the color film layer 43, the black matrix 436 separates each of the optical filter units, which can prevent color impurity caused by a long distance between the color film layer 43 and the first light-emitting substrate 41/the second light-emitting substrate 42 and improve quality of a display image. In the embodiment, the black matrix 436 further separates the first region 431 and the second region 432 on each of the optical filter units, which can further prevent color impurity and improve quality of a display image.

The color film layer 43 of the embodiment includes a red resist (R) 433, a green resist (G) 434 and a blue resist (B) 435, the red resist 433 forms a red optical filter unit, the green resist 434 forms a green optical filter unit, the blue resist 435 forms a blue optical filter unit. Therefore, in the first display image and the second display image of the embodiments, distribution of pixels can be R-R'-G-G'-B-B', R-G'-G-B'-B-R' or other pixel arrays. Certainly, in other embodiments, the color film layer can likewise include a red resist, a green resist, a blue resist and a white resist.

In summary, the disclosure is capable of simplifying the process and reducing the thickness of the product, meanwhile images on two sides do not influence each other during display on both sides, and directions of two images on both sides are identical.

Above are merely embodiments of the disclosure, which do not limit the scope of the disclosure, any modifications, equivalent replacements or improvements within the spirit and principles of the embodiments described above should be covered by the protected scope of the disclosure.

What is claimed is:

1. A double-side OLED display, wherein it comprises a first light-emitting substrate, a second light-emitting substrate and a color film layer, the first light-emitting substrate and the second light-emitting substrate are disposed opposite, the color film layer is disposed between the first light-emitting substrate and the second light-emitting substrate, light from the first light-emitting substrate partially penetrates the color film layer and forms a second display image on a side of the second light-emitting substrate, light from the second light-emitting substrate partially penetrates the color film layer and forms a first display image on a side of the first light-emitting substrate, wherein the color film layer comprises a plurality of optical filter units.

2. The double-side OLED display according to claim 1, wherein a plurality of light-emitting devices are disposed on the first light-emitting substrate and the second light-emitting substrate, the light-emitting devices on the first light-emitting substrate and the light-emitting devices on the second light-emitting substrate are staggered in a direction perpendicular to the color film layer.

3. The double-side OLED display according to claim 2, wherein one of the optical filter units comprises a first region and a second region, the first region is a region corresponding to the light-emitting devices of the first light-emitting substrate, the second region is a region corresponding to the light-emitting devices of the second light-emitting substrate.

4. The double-side OLED display according to claim 3, wherein a black matrix is disposed on the color film layer to separate each of the optical filter units.

5. The double-side OLED display according to claim 4, wherein the black matrix further separates the first region and the second region on each of the optical filter units.

6. The double-side OLED display according to claim 1, wherein the first light-emitting substrate and the second light-emitting substrate respectively comprise a substrate, a TFT/wire layer and a light-emitting device layer, the TFT/wire layer is disposed on the substrate, the light-emitting device layer is disposed above the TFT/wire layer.

7. The double-side OLED display according to claim 6, wherein the light-emitting layer has a plurality of light-emitting devices, the light-emitting device comprises a first electrode, a light-emitting layer and a second electrode, the light-emitting layer is disposed on the first electrode, the second electrode covers the light-emitting layer.

8. The double-side OLED display according to claim 7, wherein a pixel restriction layer is disposed between the first electrode and the light-emitting layer of the two adjacent light-emitting devices, to restrict shapes of the first electrode and the light-emitting layer.

9. The double-side OLED display according to claim 1, wherein the color film layer is formed above the second light-emitting substrate, when the double-side OLED display is manufactured, the first light-emitting substrate and the second light-emitting substrate with the color film layer are assembled contrapuntally; or the first light-emitting substrate, the second light-emitting substrate and the color film layer are independent structures, when the double-side OLED display is manufactured, the first light-emitting substrate, the color film layer and the second light-emitting substrate are assembled contrapuntally in sequence.

10. The double-side OLED display according to claim 1, wherein a dry layer is disposed between the first light-emitting substrate and the color film layer.

* * * * *